(12) United States Patent
Skaloud

(10) Patent No.: US 11,672,088 B1
(45) Date of Patent: Jun. 6, 2023

(54) LATCH FOR SIDEWALK ROBOT

(71) Applicant: Amazon Technologies, Inc., Seattle, WA (US)

(72) Inventor: Brett Skaloud, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 1289 days.

(21) Appl. No.: 16/046,413

(22) Filed: Jul. 26, 2018

(51) Int. Cl.
| | |
|---|---|
| *H05K 5/02* | (2006.01) |
| *H05K 5/03* | (2006.01) |
| *B60P 7/06* | (2006.01) |
| *B25J 5/00* | (2006.01) |
| *B60P 3/00* | (2006.01) |
| *B25J 9/00* | (2006.01) |
| *B65D 45/16* | (2006.01) |

(52) U.S. Cl.
CPC ............ *H05K 5/0221* (2013.01); *B25J 5/007* (2013.01); *B25J 9/0003* (2013.01); *B60P 3/007* (2013.01); *B60P 7/06* (2013.01); *H05K 5/03* (2013.01); *B65D 45/16* (2013.01)

(58) Field of Classification Search
None
See application file for complete search history.

(56) References Cited

U.S. PATENT DOCUMENTS

| | | | |
|---|---|---|---|
| 10,285,291 B1* | 5/2019 | Lam | H05K 5/0295 |
| 2018/0346207 A1* | 12/2018 | Weber | E05B 65/006 |

\* cited by examiner

*Primary Examiner* — Jerry Wu
(74) *Attorney, Agent, or Firm* — BakerHostetler

(57) ABSTRACT

A latch mechanism for a sidewalk delivery robot or container includes a plunger that extends to engage a latch body on a lid to lock the lid closed, a cable for pulling the plunger out of engagement with the lid to free the lid for opening, and a temporary catch mechanism for holding the plunger in the retracted position during an initial phase of the opening process. The catch, and therefore the plunger, is released when a forward-extending release arm of the catch is engaged by the latch body during the opening process to pivot the catch. A slot hinge mechanism includes a spring piston to guard against finger pinching and a slider that is attached to the piston of the latch mechanism by the cable. Actuation of the hinge mechanism retracts the piston to its retracted position.

18 Claims, 17 Drawing Sheets

LATCH FOR SIDEWALK ROBOT

BACKGROUND

The present invention relates to mechanical hinge and latch structure and function, and more particularly to an automated system for closing and latching, and opening and unlatching, a lid.

Automatic actuation of a lid on a locked or secured container or robot can be useful for package delivery to a recipient. For example, in the case of delivery to a person who is not at home to receive a package, the package may be housed in a locked container until the person is in a position to receive it. Or in the case of delivery by a robot, the robot itself may have a locked compartment and may wait at the home until the person is in a position to receive the package.

DETAILED DESCRIPTION OF ILLUSTRATIVE EMBODIMENTS

Figure 1:
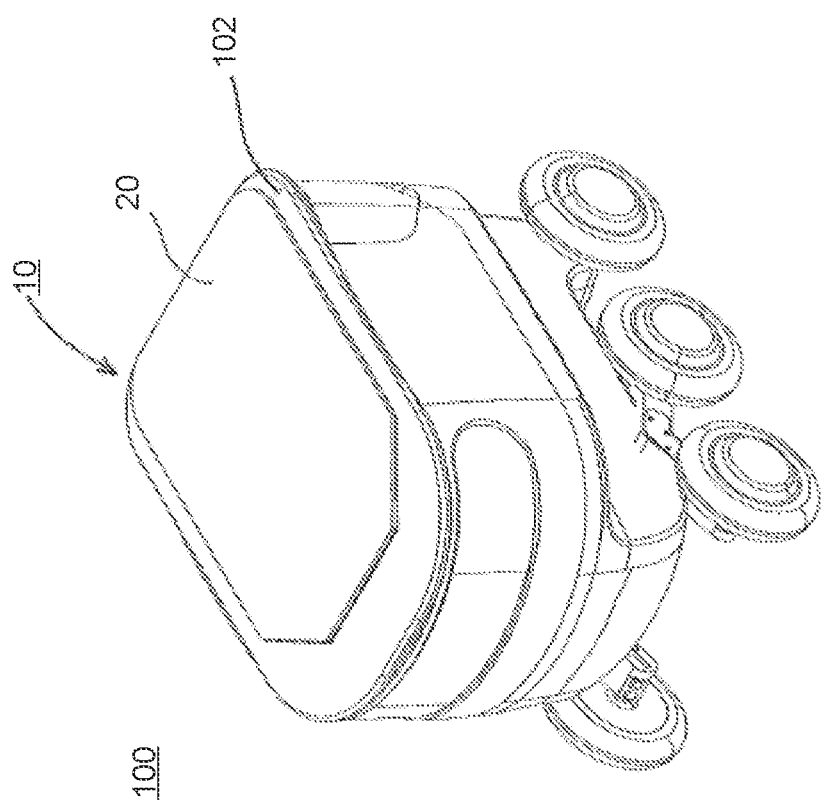
FIG. 1 is a perspective view of a robot of the type that can employ the lid, latch and hinge mechanisms disclosed herein.
Figure 2:
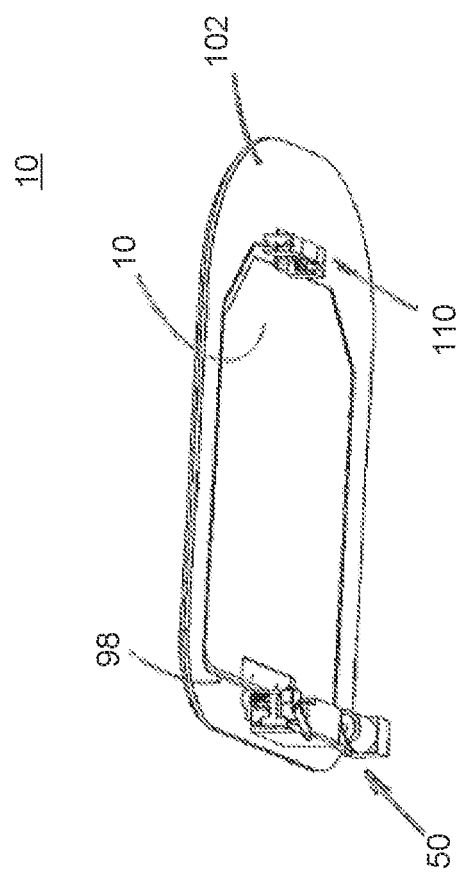
FIG. 2 is a first perspective underside view of the lid, latch assembly, and hinge mechanisms disclosed herein, which are separated from the body of the robot shown in FIG. 1.
Figure 3:
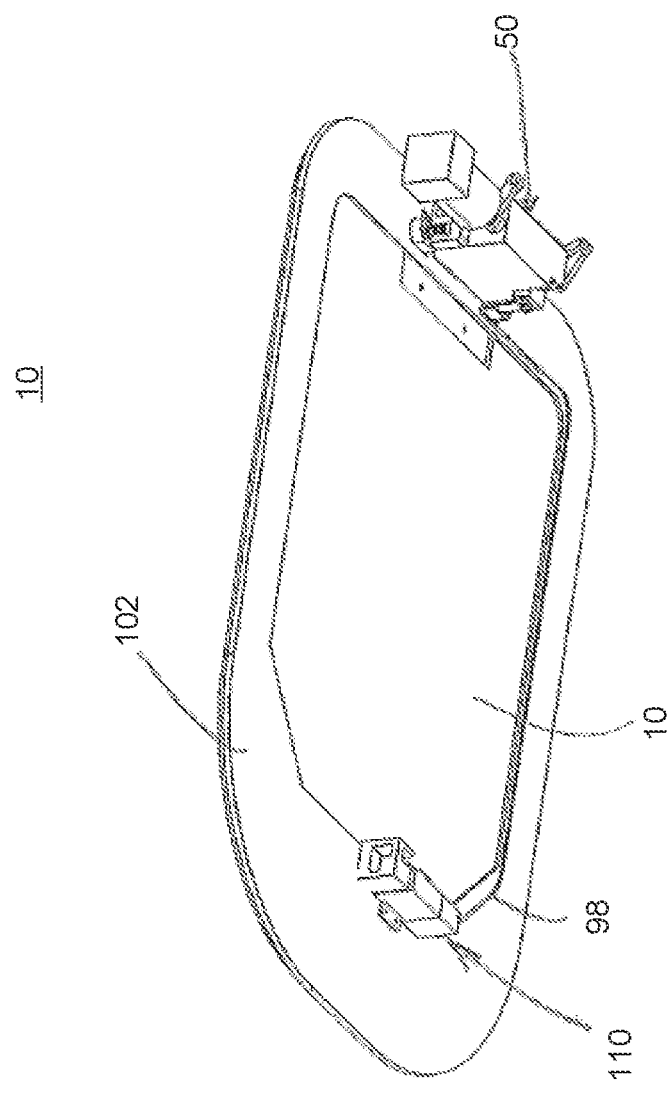
FIG. 3 is a second underside view of the components of FIG. 2.
Figure 4:
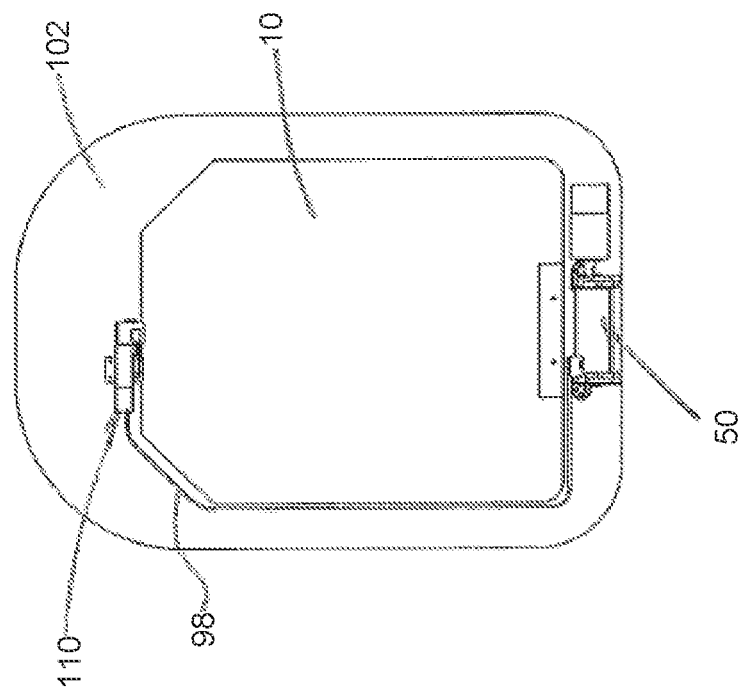
FIG. 4 is an underside plan view of the components of FIG. 2.

A lid and latch mechanism structure and function in the embodiment shown in the figures is automated and enables the end-user the open the lid while preventing unauthorized others from opening the lid. Features of the lid enable it have a safety mechanism to diminish the chances of pinching fingers or other objects when closing the lid. Further, (preferably) only one motor or other actuator is provided to pivot the lid about a slot hinge, to release a latch to unlock the lid, and to actuate the safety mechanism. Further, the single actuator may operate multiple latches.

The lid and latch mechanism in the embodiment of the figures includes a lid having an open position and a closed position; a latch body that is affixed to the lid and includes a main recess and a finger; and a plunger assembly. The plunger assembly includes a fixed housing including a catch fixture, such as a pin; a plunger that is moveable relative to the housing and biased toward an extended position relative to the housing; and a catch mechanism coupled to the plunger.

The catch mechanism includes: (i) a catch arm configured to engage the catch fixture of the housing to releasably retain the plunger in a retracted position relative to the housing, and (ii) a release arm extending outboard of the housing and configured to be engaged by the finger of the latch body while the plunger is in the retracted, retained position and to pivot the catch mechanism to release the catch arm from the catch fixture to enable the plunger to move from the retracted position toward the extended position. The catch mechanism is fixed to a seating surface on which the lid rests when in the closed position and defines an opening when the lid is in the open position.

The plunger in the extended position extends into the main recess of the latch body to retain the lid in the closed position, and the plunger in the retracted position frees the lid to move from the closed position to the open position. Preferably the plunger is biased by a spring that biasing the plunger toward the extended position. The term "fixed" refers to the being fixed relative to the robot or other container or housing on which the lid is mounted.

According to another aspect of the present invention, a hinge mechanism includes a safety feature. The hinge mechanism for opening and closing a lid of a container or sidewalk robot, comprises: a lid having an open position and a closed position; a slot hinge assembly including a pivot body; a spring piston that is connected to the lid and to the pivot body; an actuator; and a slider configured to be displaced in coordination with movement of the pivot body by the actuator. The slot hinge assembly is configured such that downward movement of the pivot body moves a portion of the spring piston downwardly against a spring force and moves the slider downwardly against a spring force of a remote latch to release the latch.

Worded another way, the hinge assembly comprises: a lid having an open position and a closed position relative to a lip of a container or robot; a fixed hinge body having a vertical slot and a curved slot that is connected to the vertical slot; a pivot body assembly including a pivot body configured to have movement that is guided by the vertical slot and the curved slot; a spring piston that is connected to the lid and to the pivot body; and an actuator and linkage configured to move the pivot body as guided by the vertical slot and the curved slot. The hinge assembly is configured such that downward movement of the pivot body moves a portion of the spring piston downwardly against a spring force.

The hinge assembly can include a slider configured to be displaced in coordination with movement of the pivot body by the actuator, whereby the downward movement of the pivot block moves the slider downwardly, and may include a spring-biased cable that is attached to the slider and oriented such that the downward movement of the slider is against the spring-bias transmitted through the cable. The cable may be attached to a latch that is spaced apart from the hinge assembly such that downward movement of the slider retracts a plunger of the latch to release the lid.

The spring piston preferably is a pinch protection mechanism, whereby the force of the spring holds the lid against the lip. And the pivot body assembly may include the pivot body and another pivot body on opposing sides of hinge body, an upper pin, and a lower, the lower pin and the upper pin extending through the body and affixing the opposing pivot blocks together, whereby when each one of the upper pin and the lower pin is in the vertical slot the pivot bodies are translated vertically.

The actuator may be adapted for moving in a first direction to drive the pivot body vertically downwardly to a lowermost position, and adapted for moving in a second direction to translate the pivot body upwardly from the lowermost position to an uppermost translated position while the upper pin and the lower pin are in the vertical slot. Further, the actuator may be adapted for continued moving in the second direction to pivot the pivot body from its uppermost translated position such that the upper pin resides in the vertical slot and the lower pin moves in the curved slot, thereby pivoting the lid toward an open position.

A method of actuating a lid of a container or sidewalk robot comprises the steps of: (a) with the lid in a closed and latched position, translating a pivot body of a slot hinge assembly downwardly to a lowermost position against the spring bias of a spring piston that is connected between the slot hinge assembly and the lid while the lid remains in the closed and latched position; (b) after the translating step (a), translating the pivot body upwardly to raise the lid without pivoting the lid; and (c) after the translating step (b), pivoting the pivot body, thereby pivoting the lid toward an open position via the spring piston.

The translating step (a) may include moving a slider to a lowermost position to pull a cable attached to the slider to pull a plunger out of engagement of a latch, thereby unlatching the lid from its latched position. And the step of pulling the cable may include catching the plunger to retain the plunger in a retracted position. Raising the lid in translating step (b) can raise a latch body of the lid to engage a finger of a catch mechanism attached to the plunger, thereby releasing the plunger to its retracted position. Each one of the translating steps (a) and (b) may include moving pins attached to the pivot body in a vertical slot by the action of a motor connected to the pins and/or pivot body by a linkage, and the translating step (a) may include guiding an upper pin and a lower pin, attached to the pivot body, in a vertical slot.

The pivoting step (c) may include moving the lower pin in a curved slot while the upper pin remains in the vertical slot. And the translating step (a) may include a motor rotating a shaft in a first direction to drive a linkage attached to the pivot body and each one of the translating (b) and the pivoting step (b) may include the motor rotating the shaft in an opposing second direction, whereby the motor rotating translates and pivots the pivot body.

FIG. 1 illustrates a robot 100 that includes an internal compartment for storing items, such as packages for delivery to an end user. The compartment is enclosed by a lid assembly 10 that closes against a lip or seat surface 102 on the top of the robot. Robot 100 has wheels that enable robot 100 to carry packages or other items to a desired location, such as near the home of the intended recipient of the packages. The robot then can wait for as long as necessary for the intended recipient to retrieve the packages. Lid assembly 10 is not limited to use with robots, but may also be used with other moveable compartments or with a stationary compartment or bin. Robot 100 includes battery power for providing power to the lid actuation motor and an authentication system or lockout to restrict opening of the lid to authorized users or upon like permission.

Referring to the figures, lid assembly 10 includes a lid 20, a pair of piston assemblies 30, hinge assembly 50, and a locking assembly 110. In the embodiment of shown in the figures, lid 20 is planar and closes flat against lip 102.

Each piston assembly 30 includes a bolt-like piston 32 that extends downwardly from the underside of lid 20 and is extends through an upper portion of body of hinge assembly 50, as explained below. Coil spring 38 is located between a head 36 on the distal end of piston 32 and a collar 80 on an upper portion of the hinge assembly. In this regard, if an object or a person's fingers is between lid 20 and seat surface 102 upon closing of the lid, spring 38 enables lid 20 to move upwardly relative to hinge assembly 50 to diminish the pinching force between lid 20 and seat surface 102.

Figure 10:
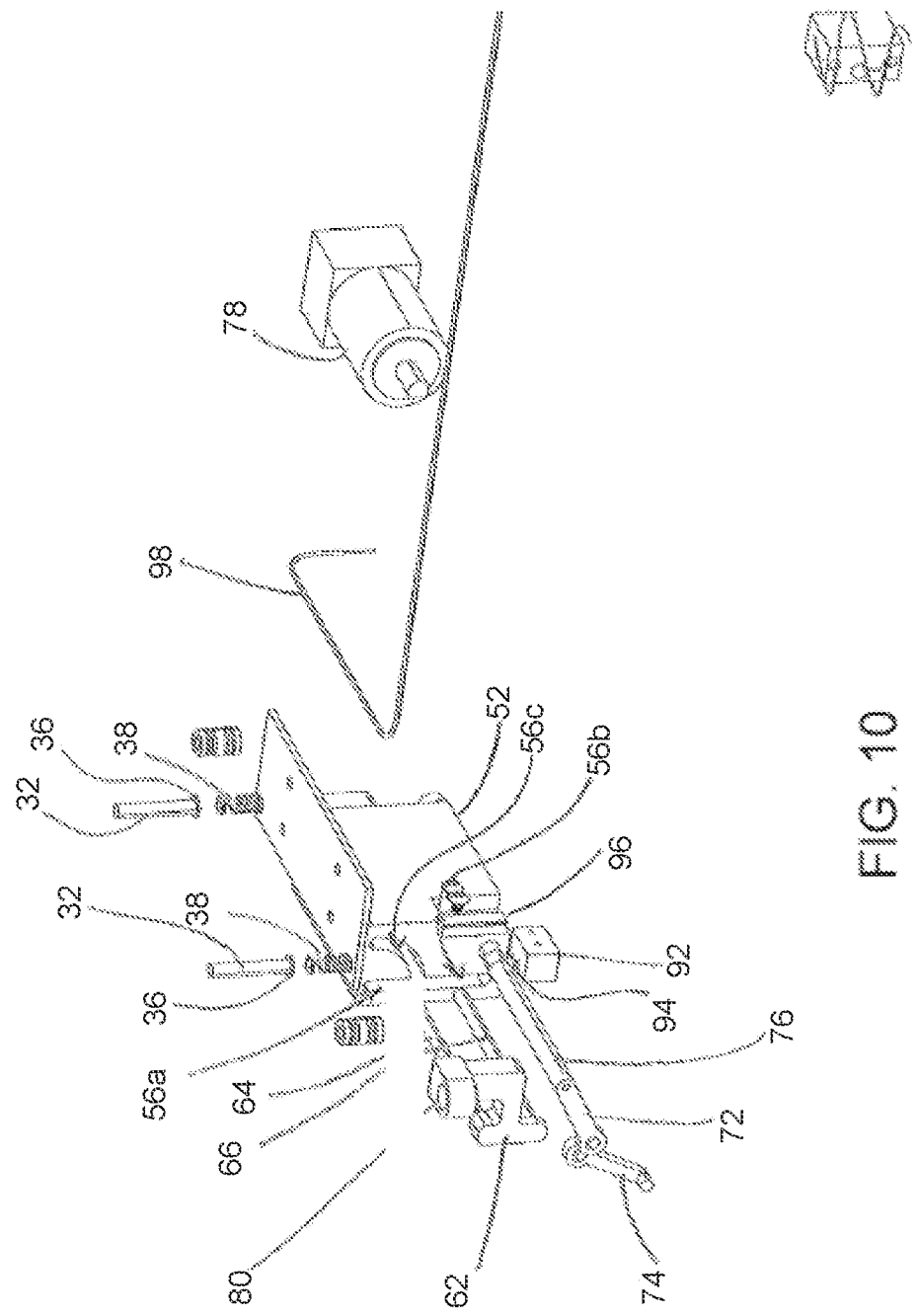
FIG. 10 is an exploded view of the components of the hinge assembly, with the lid and lip removed for clarity.

Hinge assembly 50 includes a hinge body 52, a pivot assembly 60, and a cable system 90. Hinge body 52 is fixed, such as being affixed to the underside of lip 102 or a portion of the body of robot 100 or the like. As best illustrated in FIG. 10, hinge body 52 includes slotted openings that extend through the length of hinge body 52, including a vertical slot having an upper portion 56a and a lower portion 56b that preferably are straight and co-linear. A curved slot extends from the juncture of upper and lower portions 56a and 56b and curves upwardly and inwardly toward the compartment or toward the latch mechanism 110. Slots 56a, 56b, and 56c extend through body 52 to house and pins to move therein. Body 52 is illustrated in the figures as a block, and it is contemplated that the body can have other configurations, such as sheet metal fabrications or other structures and materials for forming a slot hinge.

Pivot leg assembly 60 includes a pair of opposing pivot legs 62 on opposing sides of body 52. Pivot legs 62 are joined together by an upper pin 64 and a lower pin 66 that extend through the body 52 and can move within slots 56a, 56b, and 56c. Upper pin 64 is attached to an upper portion of pivot leg 62 and lower pin 66 is connected to a lower portion of pivot leg such that the pivot leg and the pins move together as a unit. A leg extension 68 extends forwardly and upwardly from leg 62 and terminates in a collar 80, through which the piston 32 extends. Preferably, pivot let 62 and leg extension 68 are integrally formed as a unit.

A lower link 72 and an upper link 74 connect a motor 78 to pivot leg 62 on each side of body 52 (that is, each side of body 52 has a pair of links 72, and pair of links 74, and a pair of pivot legs 62 and leg extensions 68). Motor 78 is connected to a lower end of lower link 72 on one side of body 52. A linkage pin 76 extends through an aperture in body 52 to connect to the lower ends of opposing lower links 72 together. Pin 76 only requires rotation. In this way, linkage pin 76 connects opposing linkages 72 together such that only one motor 78 is required to actuate both sides of hinge assembly 50. On each side of body 52, an upper end of linkage 72 is connected to the lower end of upper linkage 74. And an upper end of linkage 74 is connected to the lower end of pivot leg 62. Motor 78 in the embodiment of the figures is a DC servo motor with an encoder.

Cable system 90 includes a sliding follower or slider 92 having slots 94 that mate to corresponding slots 96 on body 52, which enables slider 92 to freely slide up and down in the corresponding slots. In the embodiment shown in the figures, block slots 94 and mating slider slots 96 are configured in a mating dovetail configuration.

A cable 98 is attached to slider 92 such that movement up and down of slider 92 moves cable 98 to extend or retract cable 98. Cable 98 is attached to the underside of lip 102 in the embodiment shown in the figures, and may be any type, such as a cable within a coaxial outer sheath that can be affixed to enable the inner cable to move within the sheath, such as a type used in bicycles.

Locking system 110 includes a lid latch body 120 and a latch assembly 140. As illustrated in the figures, lid latch body 120 is affixed to the underside of lid 20 such that body 120 moves with lid 20. Latch assembly 140 is affixed to the underside of lip 102 and aligned with latch body 120. Body 120 is on the opposing end of lid 20 from hinge assembly 50.

Latch body 120 is a block, preferably formed of an engineering plastic, having a front-opening recess 122 and a bottom opening recess 124 that are in communication. A finger 126 in the embodiment of the figures is horizontal and projects part way into bottom-opening recess 124. Front-opening recess 122 is referred to herein as the plunger recess. The bottom opening recess 124 is referred to as the catch recess or the finger recess.

Latch assembly 140 includes a body 142, a plunger assembly 150, and a ratchet or catch assembly 170. Body 142 is affixed to lip 102 and includes a longitudinal, horizontally oriented recess 144 for receiving the plunger body 142.

Figure 11:
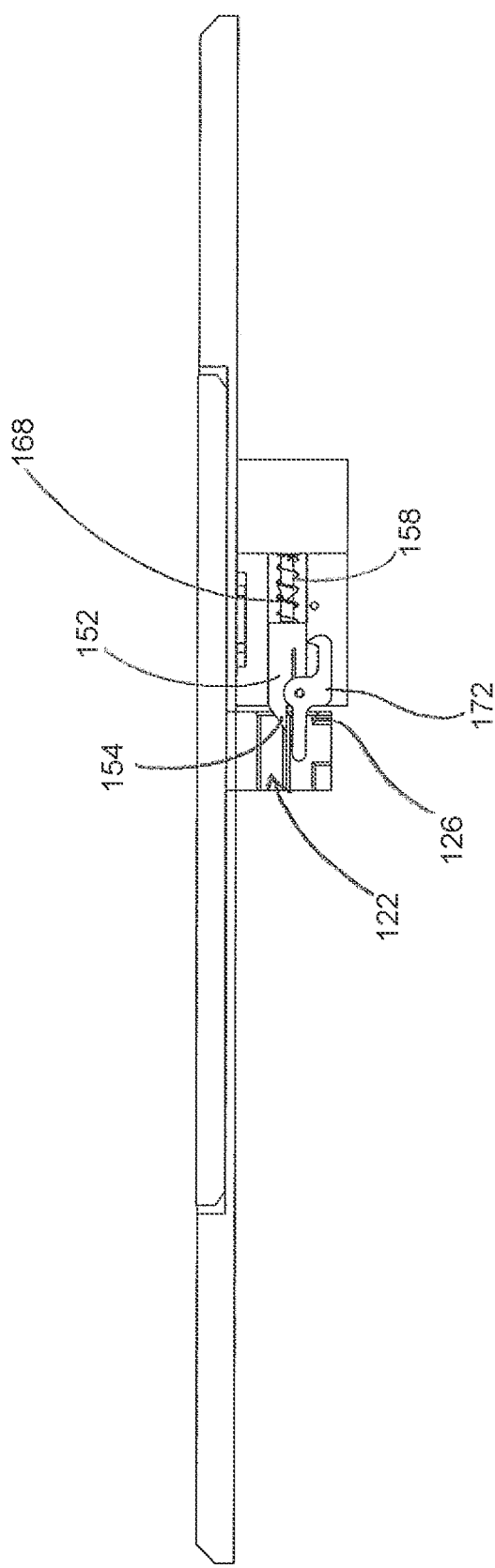
FIG. 11 an enlarged view of a portion of the latch assembly illustrating the locked or latched position in which the plunger extends in the recess of the latch body, which corresponds to the lid in the fully closed position.
Figure 16:
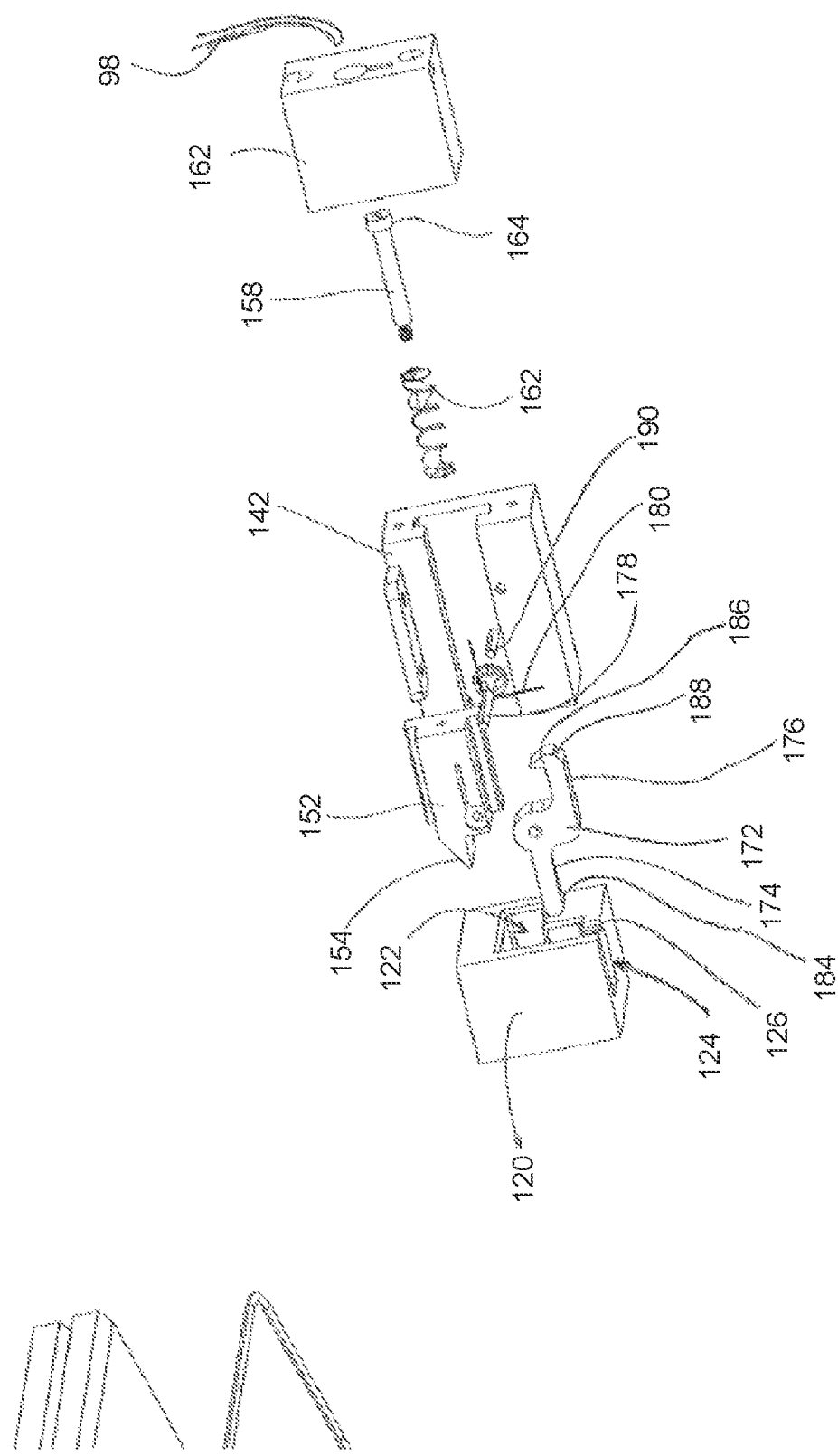
FIG. 16 is an exploded view of the components of the latch assembly, with the lid and seat removed for clarity.

As illustrated for example in FIGS. 11 and 16, plunger assembly 150 includes a plunger body 152 having a tapered or downwardly angled leading tip or distal tip 154, a piston 158 extending form the proximal end (that is, opposite the distal tip) of plunger body 152, a block 162 for housing the retaining a head 164 of piston 158, and a spring 168. Plunger body 152 includes guides that run in guide slots formed in body 152 to enable body 152 to translate within recess 144.

Spring 168 is located between a front face of block 162 and the distal face of plunger body 152 to bias body 152 to the extended position, which in FIGS. 11 and 16 is to the left. The head of piston 164 is retained in block 162 to limit the extent of the translation of piston 158 and in this way acts as a stop on the extension of plunger body 152. Cable 98 extends through an aperture in block 162 and is affixed to piston head 164 such that pulling cable 98 moves piston 158 within fixed block 162, which retracts plunger body 152 against the biasing force of spring 168.

Catch assembly 170 includes a catch body 172 that pivots on a shaft mounted to plunger body 152, and a torsional spring 180 that biases catch body 172 to its horizontal or rest position, as shown for example in FIGS. 11 and 16. Catch assembly 170 is carried by and moves with the plunger body 152.

Catch body 172 includes a forward-extending release arm 174 and a rearward-extending catch arm 176, each of which extends from a center portion of body 172. Body 172 pivots about its center portion on a pin 178 that is mounted on plunger body 152. Release arm 174 includes a finger 184 at or near its distal end that protrudes horizontally and transversely from release arm 174. Catch arm 176 includes a hook 186 at or near its distal end (that is, relative to the pivot pin 178) and has a curved outer wall 188. Catch assembly 170 works with a pin 190 that is affixed to latch body 142, as explained below.

Figure 5:
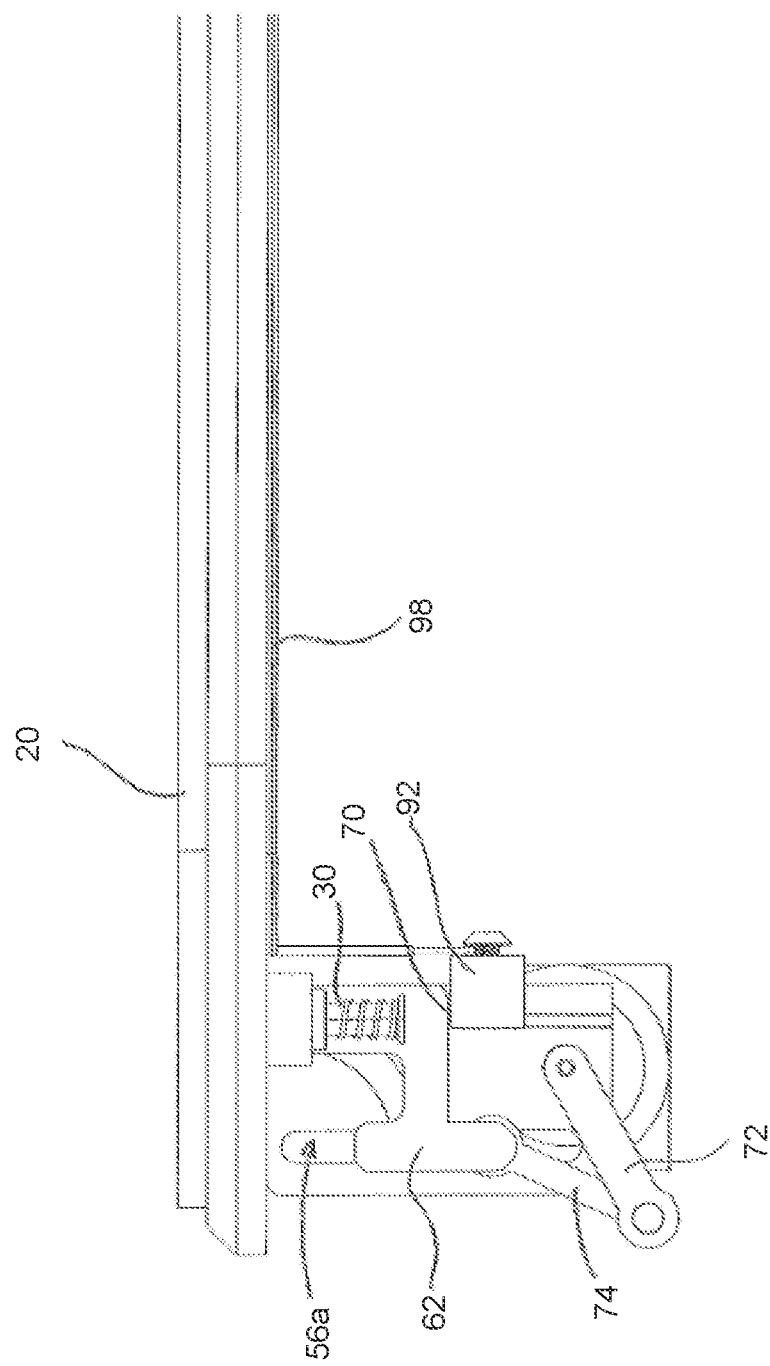
FIG. 5 is an enlarged side view of the hinge mechanism with the lid in the fully closed position.
Figure 6:
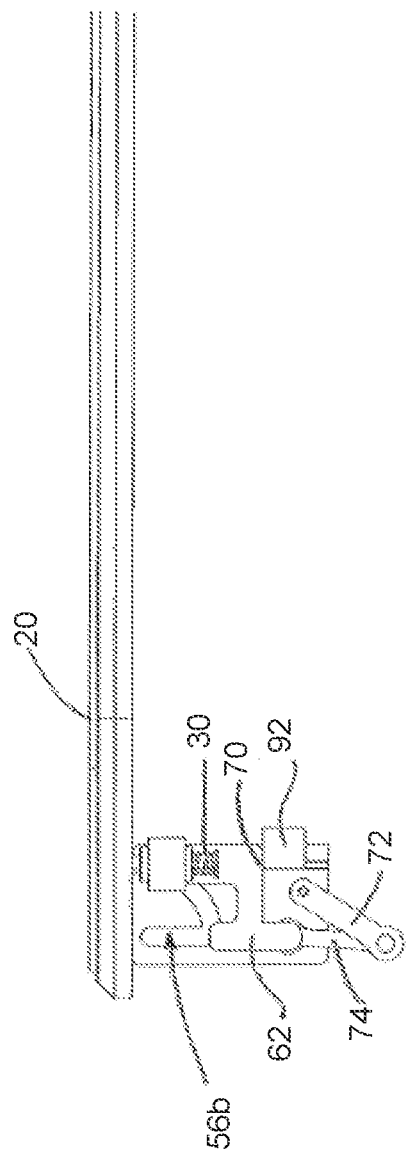
FIG. 6 is an enlarged side view of the hinge mechanism of FIG. 5 with the lid in the fully closed position and corresponding to latching of the plunger assembly.

FIG. 5 through FIG. 9 illustrate the process of opening lid 20. FIG. 5 illustrates lid 20 in its fully closed configuration in which slider 92 is in its biased, up position. In the embodiment of the figures, the same spring 168 that biases plunger body 152 toward the engaged or latched position pulls on cable 98 to bias slider 92 upwardly. Thus, when plunger body 152 is in the latched position shown in FIG. 11 (which corresponds to the latched position of hinge assembly 50 shown in FIG. 5), spring 168 biases slider 92 upwardly via tension on cable 98. As illustrated, the mutual slots 94 and 96 end at a shoulder on slider block 92, which forms a stop on the movement of slider 92.

Lid 20 in the down and locked position while plunger assembly 150 latches lid 20. In this regard, lid 20 is prevented from being opened by plunger body 152 being in the extended position and protruding into recess 122 of latch body 120. If an attempt is made to lift manually lift lid 20, such as might occur by tampering, the underside of the distal tip 154 would contact the lower boundary of recess 122, thereby preventing or limiting opening lid 20.

The opening process may include a release by an authentication mechanism. For example, if system 100 is a robot for home delivery of packages, an authorized recipient of the packages may enter a code or like information into a keypad on robot 100 or onto a smartphone or other device, or may contact a party authorized to being the opening process, or may be authenticated by other means, such as face recognition, fingerprint recognition, or the like. Upon satisfaction of the authentication safeguards, a signal may be sent to motor 78 to move by a predetermined angle to drive lower link 72 down or counterclockwise, which in turn moves pivot leg 62 downward within slot 56b to the position shown in FIG. 6. Pivot leg 62 is held in an approximately vertical configuration by pins 64 and 66 in vertical slot 56b. Accordingly, pivot leg 62 and leg extension 68 are held in an upright position such that a shoulder 70 on the underside of leg extension 68 drives slider 92 downwardly against the biasing force of spring 168.

Figure 12:
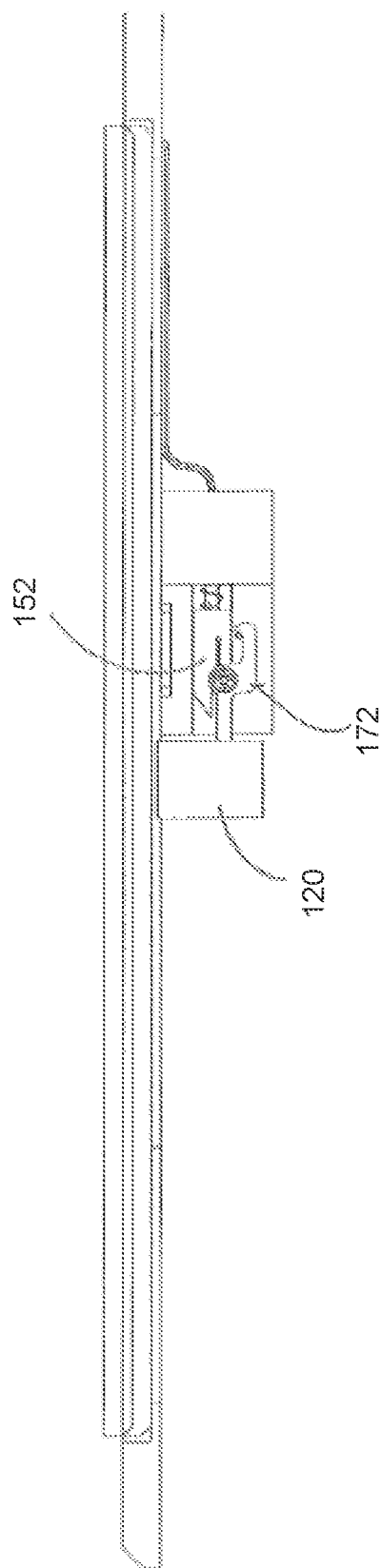
FIG. 12 is a side view of the plunger in the fully retracted position with the catch mechanism engaged.
Figure 13:
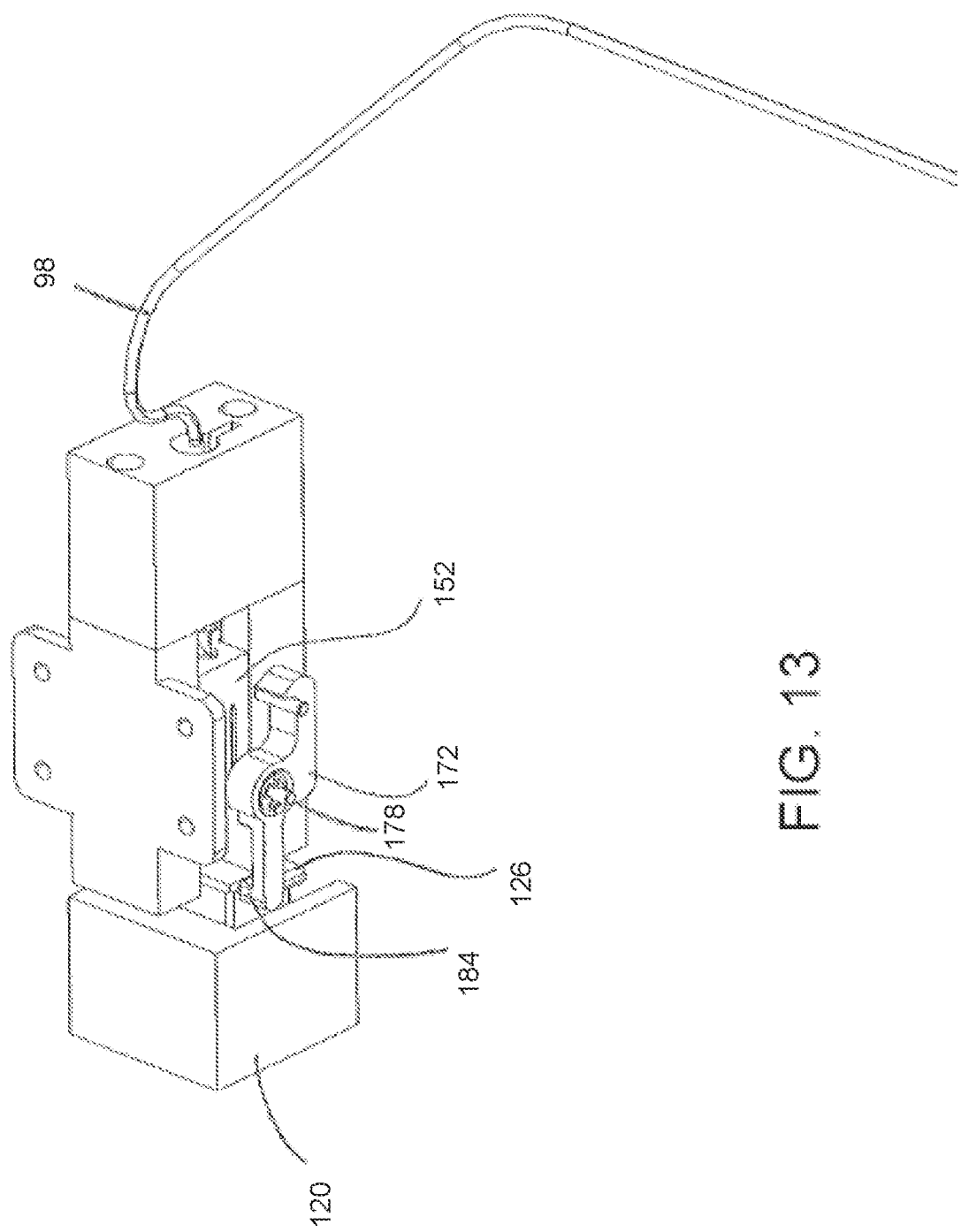
FIG. 13 is a perspective view of the latch mechanism shown in FIG. 12 with some parts removed for clarity.

Referring to FIGS. 11 through 13, downward movement of slider 92 (from the downward motion of leg extension 68) pulls cable 98, which retracts plunger body 152 from engagement with latch body 120 to the position shown in FIG. 12. As shown in FIG. 12, catch body 172 has been translated with plunger body 152 rearwardly (rightward in the figures) until curved outer wall 188 of catch body 172 contacts fixed pin 190. As catch body 172 continues its rearward motion, pin 190 imparts a force on curved surface 188 to produce a moment about catch pivot shaft pin 178 in a clockwise direction (as oriented in FIG. 12). Catch spring 180 biases catch body 172 counterclockwise such that upon clearing pin 190, hook 186 of catch assembly 170 engages pin 190 to retain plunger body 152 in its fully retracted position, in which latch body 120 is clear of plunger tip 154, as illustrated in FIGS. 12 and 13.

Figure 7:
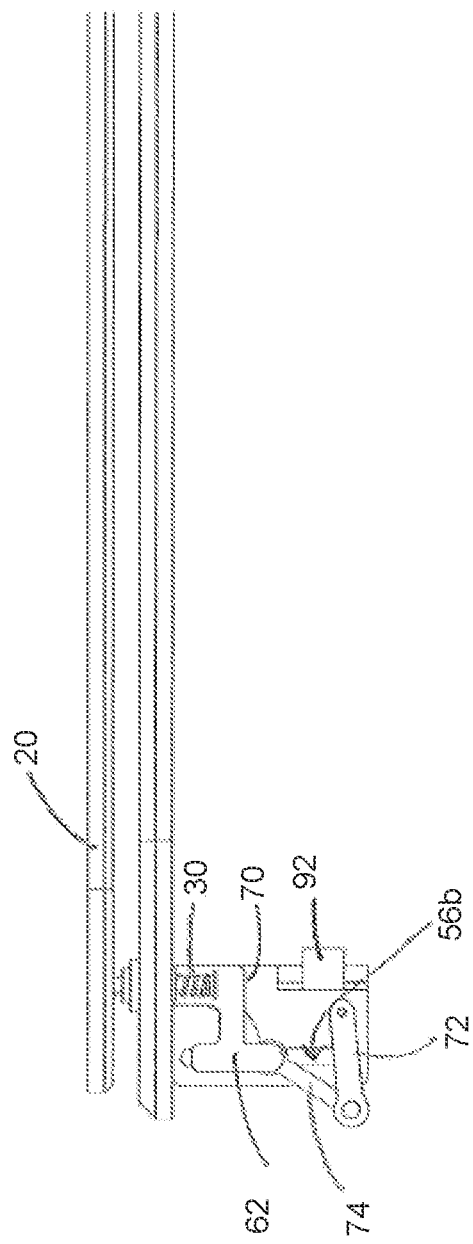
FIG. 7 is an enlarged side view of the hinge mechanism of FIG. 5 with the lid in initial opening stage.

The opening process continues as motor 78 drives lower link 72 clockwise (again, as oriented in FIGS. 5 through 9) to drive pivot leg 62 from its lower position upwardly past the rest position of FIG. 5 to the position shown in FIG. 7, in which leg 62 is still guided to be vertical by pins 64 and 66 being in vertical slot 56a. As illustrated in FIG. 7, the upward translation of leg 62 also translates leg extension 68, which in turn moves lid 20 to a position in which it is spaced apart from lip 102.

Figure 14A:
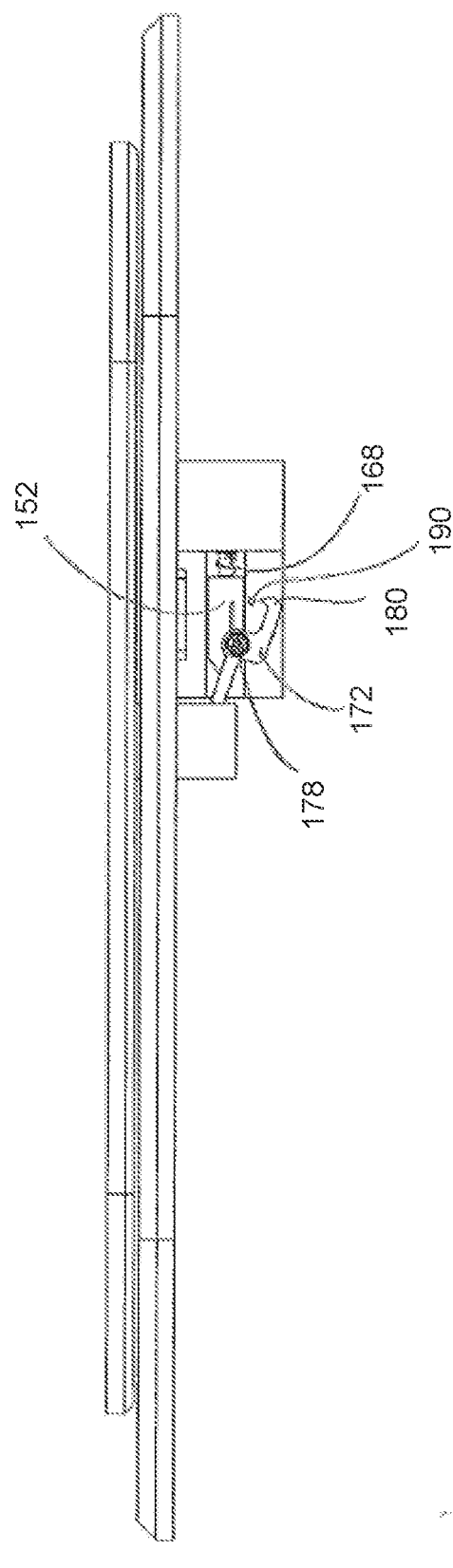
FIG. 14A is a side view of the catch mechanism rotated by the upward movement of the latch body.
Figure 14B:
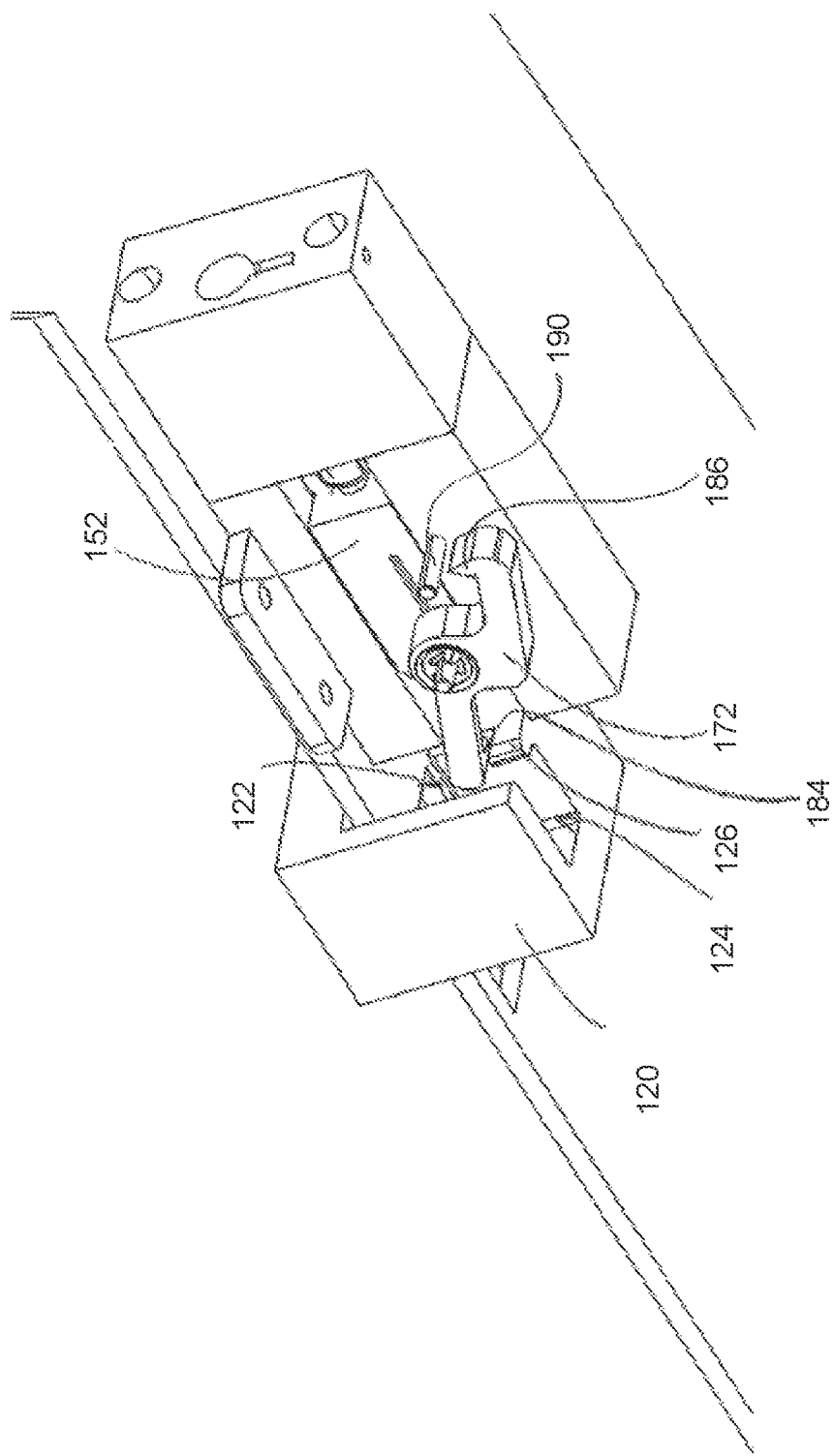
FIG. 14B is a perspective view of the latch mechanism of FIG. 14A with some parts removed for clarity.
Figure 15:
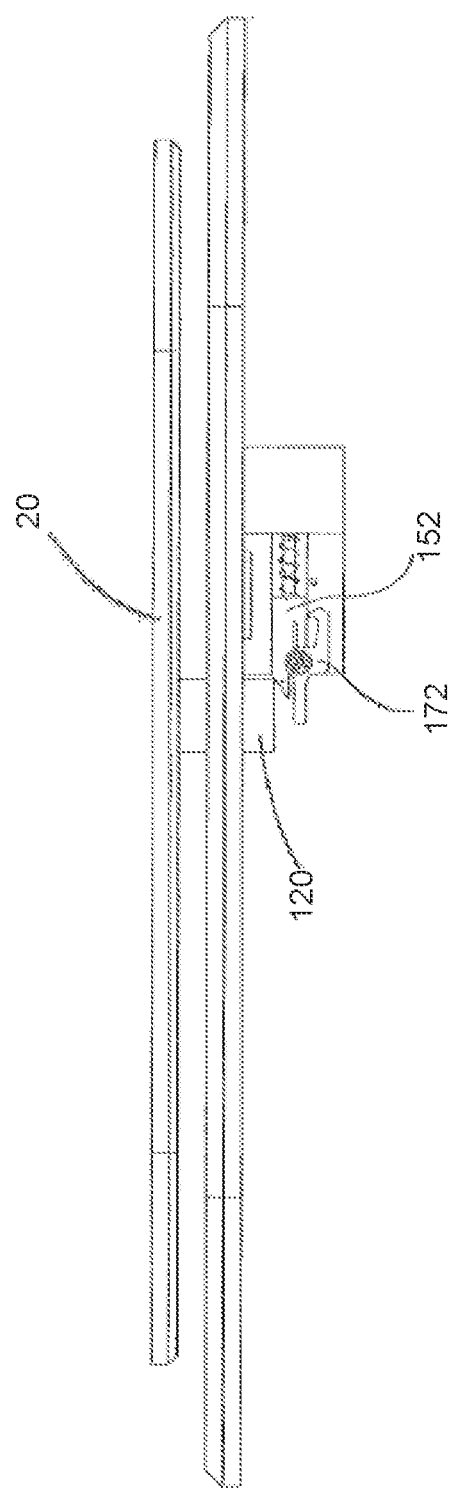
FIG. 15 is a side view of the plunger fully extended and the latch body clear of the plunger.

Referring to FIGS. 14A and 14B, as lid 20 moves to the up position shown in FIG. 7, latch body 120 moves up relative to latch assembly 140, unencumbered by now-retracted plunger body 152. In the retracted position of the plunger, finger 184 of catch assembly 170 is aligned with finger 126 of latch body 120. Thus, upon upward movement of lid 20, fingers 126 and 184 engage to pivot catch body clockwise (as oriented in FIGS. 14A and 14B) to free hook 186 from pin 190. Because of the biasing force of spring 168, plunger body 152 moves from the retracted position toward the extended position upon release of catch assembly 170 and cable 98 pulls slider 92 upwardly. FIG. 15 illustrates plunger body 152 in its fully extended position after latch body 120 has cleared release arm 174 and its finger 184. As shown in the figures, bottom-opening recess 124 is configured such that release arm 174 of catch assembly 170 does not engage latch block 120 except for the contact between fingers 136 and 184. Thus, lid 20 is free from plunger assembly 150.

Figure 8:
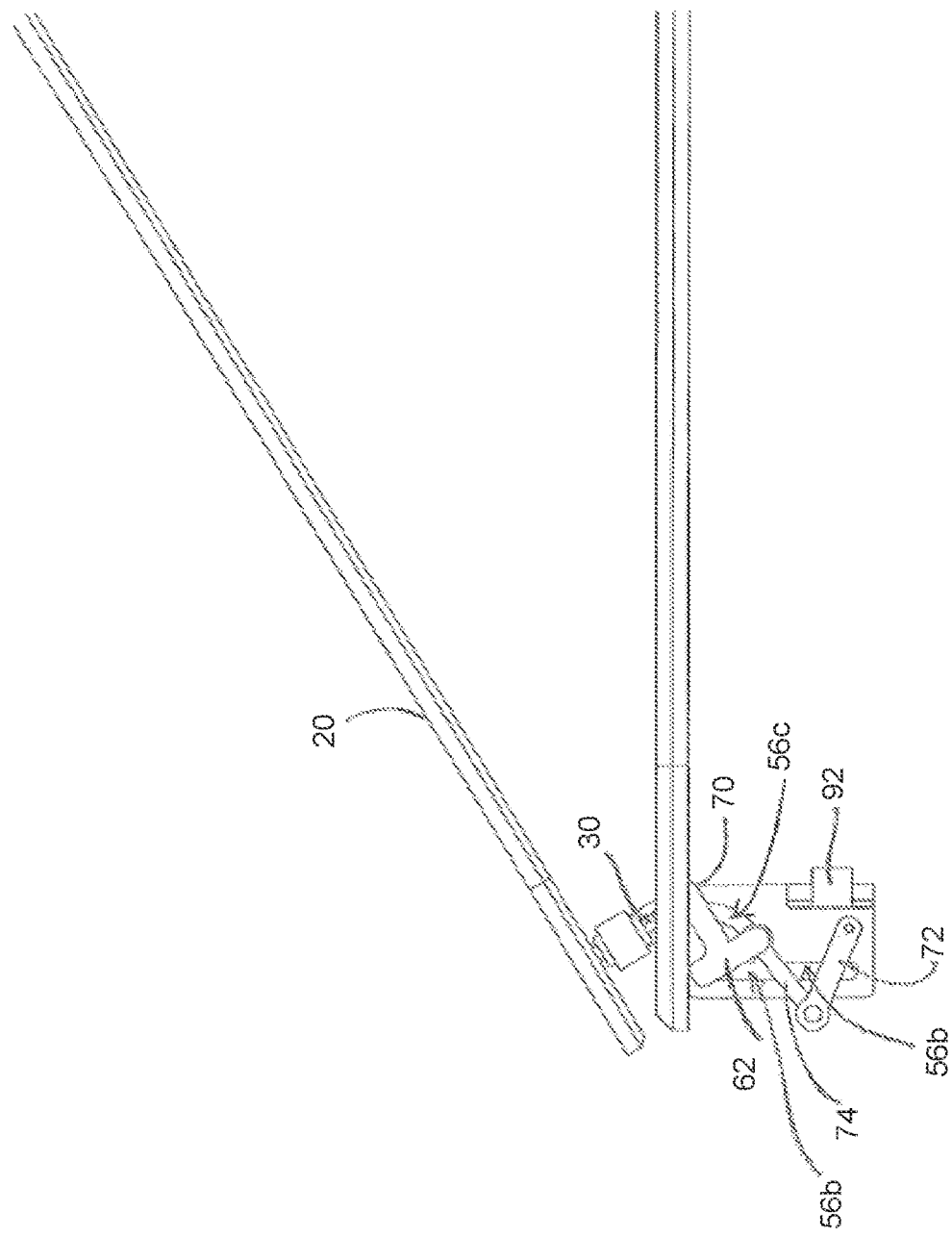
FIG. 8 is an enlarged side view of the hinge mechanism of FIG. 5 with the lid in a partially open position.

Motor 78 may continue moving hinge assembly 50 from the position shown in FIG. 7 to that shown in FIG. 8. In this regard, clockwise movement of the motor to produce clockwise movement of lower link 72 transmits a force through upper link 74 to the lower portion of pivot leg 62. Upper pin 64 remains in upper straight slot 56a while the rotation of links 72 and 74 drive lower pin 66 into curved slot 56c, thereby pivoting pivot leg 62 and in this regard pivoting lid 20 from its horizontal or rest position toward opening, as illustrated in FIG. 8.

Figure 9:
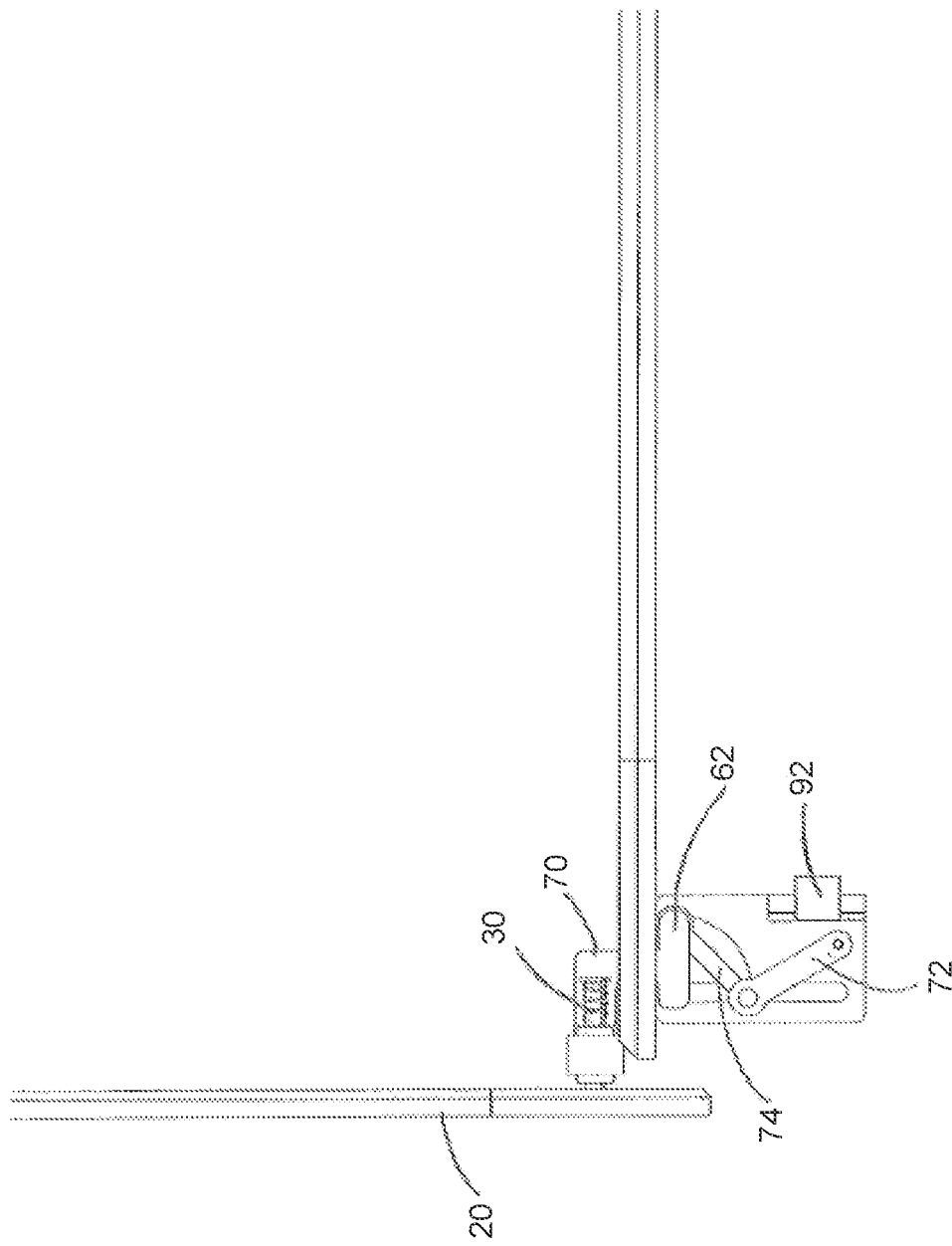
FIG. 9 is an enlarged side view of the hinge mechanism of FIG. 5 with the lid in a fully open position.

Motor 78 continues to drive links 72 and 74 to further pivot or rotate pivot leg 62 and the further open lid 20 to its fully open position shown in FIG. 9. Motor 78 can stop the actuation by any means, such as by encoder information or the like. After a user or customer has finished accessing the chamber inside robot 100 or performed other desired tasks, the closing process can repeat the steps above in the opposite order to move pivot leg clockwise from the fully open position shown in FIG. 9 through the positions shown in FIG. 8 and FIG. 7.

Further movement in the closing process (from the position shown in FIG. 7) can translate pivot leg 62 downwardly, which moves latch body 120 downwardly. Plunger body 152 during the closing process is in the extended position as explained above. Thus, as latch body 120 moves downwardly, an edge on the underside of latch body 120 contacts the sloped or angled lip 154 of plunger body 152, which pushes plunger body 152 rearwardly within recess 144 against spring 168 bias. Upon further downward movement of latch body 120, plunger tip 154 becomes aligned with recess 144. Upon alignment of tip 154 and recess 144, spring 168 bias pushes plunger body 152 into recess 144 to latch lid in the closed position.

It is also contemplated that the hinge system can include any type of linkage and any type of actuator. For merely one example, the hinge may be actuated by a linear actuator of any type, such as a mechanical screw, air cylinder, or the like, and still be within the scope of the invention. Further, any kind of linkage or transmission between the actuator and the moveable portions of the hinge is contemplated, without limitation.

The present invention has been described by employing an embodiment. The present invention is not limited to the particular embodiment described in the above text nor in the figures. Rather, the inventors contemplate that other structures and variations will be apparent from the present disclosure and intend the claims to be given their broadest scope.

What is claimed is:

1. A automated lid and latch mechanism for opening and closing a lid of a container or a robot, comprising:
    the lid having an open position and a closed position;
    a latch body on the lid;
    a plunger assembly including:
        a moveable plunger that is spring biased toward engagement with the latch body and adapted to be pulled toward a retracted position, in which the plunger is engaged with the latch body, by a cable;
        a catch mechanism coupled to the moveable plunger and adapted to be carried by the moveable plunger, the catch mechanism being configured to (i) temporarily retain the moveable plunger in a retracted position during initiation of opening of the lid and (ii) be released by upward movement of the latch body to free the moveable plunger from being retained by the catch mechanism;
    whereby the moveable plunger when engaged with the latch body retains the lid in the closed position, and the moveable plunger in the retracted position frees the lid for opening.

2. The automated lid and latch mechanism for opening and closing the lid of the container or robot of claim 1 wherein the movable plunger has an angled contact surface that is configured to move the plunger toward the retracted position upon contact with the latch body during closing of the lid.

3. The automated lid and latch mechanism for opening and closing the lid of the container or robot of claim 2 wherein the plunger assembly includes a spring that biases the plunger toward the extended position, the spring having one end that engages the plunger and an opposing end that engages the housing.

4. The automated lid and latch mechanism for opening and closing the lid of the container or robot of claim 1 wherein catch mechanism includes a pin mounted on the plunger about which the catch mechanism is capable of pivoting.

5. The automated lid and latch mechanism for opening and closing the lid of the container or robot of claim 4 wherein fixture is the pin fixed to the housing, and the catch arm includes a hook adapted for engaging the pin and a biasing spring for spring biasing the hook toward a catch position.

6. The automated lid and latch mechanism for opening and closing the lid of the container or robot of claim 5 wherein the latch body main recess is a front-opening recess, and the latch body includes a bottom-opening recess adapted for receiving the release arm.

7. The automated lid and latch mechanism for opening and closing the lid of the container or robot of claim 6 wherein the release arm includes a finger that engages a portion of the latch body upon opening the lid to pivot the catch mechanism to release the hook from the pin.

8. The assembly of claim 1 wherein the cable coupled to the plunger and adapted to pull the plunger toward the retracted position.

9. The assembly of claim 8 wherein the cable the cable is pulled by operation of an actuator that opens the lid.

10. A method of actuating a lid for a robot, comprising a plurality of steps of: a) with the lid in a closed position, retracting a plunger of a fixed housing from an extended position, in which the plunger in engaged with a latch body that is coupled to the lid when the lid is in an open position, to a retracted position, in which the plunger is disengaged with the latch body, thereby freeing the lid from a catch mechanism; b) after the retracting step (a), retaining the plunger in the retracted position upon initial opening of the lid; c) lifting the lid after the retracting step (b); and d) after initiation of the lifting step (c), releasing the plunger from being retained during the retaining step (b).

11. The method of claim 10 further comprising the step of closing the lid with the plunger in the extended position such that the latch body contacts an angled surface of the plunger to move the plunger toward the retracted position.

12. The method of claim 11 wherein the closing step further comprising biasing the plunger toward engagement with the latch body such that upon the lid reaching the closed position, the plunger engages the latch body to latch the lid in the closed position.

13. The method of claim 10 wherein the retracting step (a) includes retracting a catch mechanism mounted on the plunger.

14. The method of claim 13 wherein the retaining step (b) includes engaging a hook of the catch mechanism on a fixture, thereby retaining the plunger.

15. The method of claim 14 wherein the retracting step (a) includes moving a curved surface of the hook against the plunger to pivot the catch mechanism, thereby enabling the hook to engage the fixture.

16. The method of claim 15 wherein the retaining step (b) includes biasing the catch mechanism toward a catch position by a spring, such that the retracting step includes pivoting the catch mechanism against the spring bias.

17. The method of claim 10 wherein the retracting step (a) includes pulling the plunger toward the retracted position by a cable.

18. The method of claim 17 wherein the pulling step includes pulling the cable by action of an actuator.

* * * * *